United States Patent [19]

Watanabe

[11] Patent Number: 4,462,873
[45] Date of Patent: Jul. 31, 1984

[54] METHOD OF FIXEDLY ARRANGING AN ARRAY OF ELECTROFORMED LETTERS OR THE LIKE ON AN ARTICLE

[76] Inventor: Eiji Watanabe, 65-26, Ibukino, Midori-ku, Yokohama, Japan

[21] Appl. No.: 513,150

[22] Filed: Jul. 12, 1983

[30] Foreign Application Priority Data

Jul. 16, 1982 [JP] Japan ............................ 57-124259
Jan. 31, 1983 [JP] Japan ............................ 58-014399

[51] Int. Cl.³ ........................................ C25D 1/20
[52] U.S. Cl. ............................................. 204/4
[58] Field of Search ............... 204/3, 4, 8, 12, 13, 204/18.1

[56] References Cited

U.S. PATENT DOCUMENTS

3,414,487 12/1968 Helms .................................. 204/13
3,998,601 12/1976 Yates .................................. 204/12
4,053,370 10/1977 Yamashita ........................ 204/13

FOREIGN PATENT DOCUMENTS

51-37617 10/1976 Japan .............................. 204/281

*Primary Examiner*—Thomas Tufariello
*Attorney, Agent, or Firm*—Nolte, Nolte and Hunter

[57] ABSTRACT

Fixedly arranging an array of electroformed letters or patterns on a product which includes the steps of forming a layer of resist on a metallic plate, electroforming letters, removing the electroformed letters from the plate with adhesive tape, coating each of the exposed surfaces of the electroformed letters with an adhesive, placing the electroformed letters and tape on the product and peeling the tape from the electroformed letters. The adhesive has an adhering power stronger than that of the adhesive tape so that the tape can be removed readily from the electroformed letters. The resist is applied to an area on the metallic plate except for the area occupied by the letters to be electroformed. The adhesive coated surface of the electroformed letters may be covered with protective paper.

To inhibit excessive electroforming along the periphery of the letters and minimize excessive application of the adhesive on the tape there are electroformed "sacrifice portions" adjacent the electroformed letters with a narrow layer of resist deposited therebetween. The sacrifice portions are removed from the tape after the adhesive agent is coated on each of the exposed surfaces of the letters and the sacrifice portions.

8 Claims, 17 Drawing Figures

FIG. 5
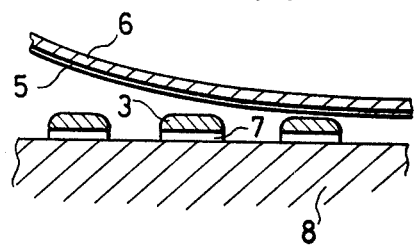
FIG. 6
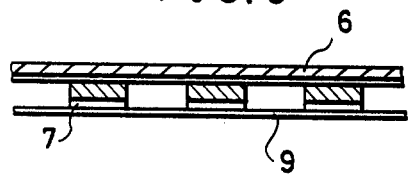
FIG. 7
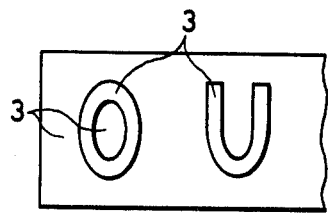
FIG. 8
OUDENSHA

METHOD OF FIXEDLY ARRANGING AN ARRAY OF ELECTROFORMED LETTERS OR THE LIKE ON AN ARTICLE

BACKGROUND OF THE INVENTION

The present invention relates to a method of fixedly arranging an array of electroformed letters, letter-shaped patterns or the like in correct alignment in a spaced relation on a selected product and more particularly to a method of electroforming a plurality of letters or the like patterns and fixedly arranging them in line in a predetermined spaced relation on an article such as a case, panel or the like with the aid of an adhesive tape and additionally a coated adhesive agent.

As is well known, it takes a long time and requires highly trained skill to arrange a series of letters in correct line in an equally spaced relation on a selected commodity and fixedly attach them to the latter and there have been hitherto made few proposals for arranging an array of letters or the like patterns in correct alignment on an article.

SUMMARY OF THE INVENTION

Thus, the present invention has been made with the foregoing background in mind.

According to an aspect of the invention a method of fixedly arranging a plurality of electroformed letters or the like patterns in correct alignment on a product essentially comprises the steps of applying a layer of resist onto a metallic plate, carrying out electroforming with the metallic plate immersed in an electrolyte bath, removing electroformed letters from the metallic plate with the aid of an adhesive tape, coating each of the exposed surfaces of the electroformed letters with an adhesive agent, placing the assembly of electroformed letters and adhesive tape on a selected product with some depressing force and finally peeling off the adhesive tape from the electroformed letters. The layer of resist is applied onto an area on the metallic plate excluding an area occupied by letters or the like patterns to be electroformed. The adhesive agent to be coated on each of the exposed surfaces of the electroformed letters has an adhering power higher than that of the adhesive tape and therefore the letters are transferred onto the surface of the product without fail when the adhesive tape is finally peeled off. The adhesive agent is preferably applied by roller coating.

To assure that the assembly of electroformed letters and adhesive tape is stored prior to practical use or before it is transported to the position where it is in use without any fear of causing it to be adversly affected by dust the adhesive coated surface of the electroformed letters is covered with a strip of protective paper.

To inhibit excessive electroformation in the shape of a raised part along the periphery of letters to be electroformed and moreover minimize unnecessary sticking of the adhesive agent to the tape there are electroformed according to another aspect of the invention so-called sacrifice portions in the proximity of electroformed letters with a narrow layer of resist deposited therebetween. The sacrifice portions electroformed together with the letters are removed from the adhesive tape after an adhesive agent having a higher adhering power is coated on each of the exposed surfaces of both the electroformed letters and the sacrifice portions. They are manually removed therefrom with the aid of a suitable tool or device. When the sacrifice portions are employed, the adhesive agent is preferably applied by spray coating.

Thus, it is an object of the present invention to provide a method of fixedly arranging a plurality of electroformed letters or the like patterns in correct alignment on a selected product whereby they are transferred onto the surface of the product reliably without any special skill.

It is another object of the present invention to provide a method of fixedly arranging a plurality of electroformed letters or the like patterns in correct alignment on a selected product which can be practiced at an inexpensive manufacturing cost.

The above and other object, features and advantages of the invention will be more clearly apparent from a reading of the following description made in conjunction with the accompanying drawings.

BRIEF DESCRIPTION OF THE DRAWINGS

The accompanying drawings will be briefly described below.

FIGS. 1 to 8 schematically illustrate the first embodiment of the invention, wherein FIG. 1 is a partial sectional view schematically illustrating the first step in which a layer of resist is applied onto a metallic plate.

FIG. 2 is a partial sectional view schematically illustrating the second step in which a plurality of letters are electroformed.

FIG. 3 is a partial sectional view schematically illustrating the third step in which a strip of pressure sensitive adhesive film is adhesively secured to the electroformed letters so that the letters are removed from the metallic plate.

FIG. 4 is a partial sectional view schematically illustrating the fourth step in which each of the exposed surfaces of the electroformed letters is coated with an adhesive agent having a relatively high adhering power.

FIG. 5 is a partial sectional view schematically illustrating the fifth step in which the assembly of electroformed letters and film is placed on a product with some depressing force exerted thereon and the film is then peeled off therefrom.

FIG. 6 is a partial sectional view schematically illustrating a modification from the fifth step in FIG. 5. where the assembly of electroformed letters and film is covered with a strip of protective paper.

FIG. 7 is a partial plan view of the product with a few electroformed letters adhesively secured to the surface thereof, shown in an enlarged scale, and FIG. 8 is a plan view of the product with an array of the electroformed letters "OUDENSHA" adhesively secured to the surface thereof.

FIGS. 9 to 17 schematically illustrate the second embodiment of the invention, wherein FIG. 9 is a partial sectional view schematically illustrating the first step in which a layer of resist is applied onto a metallic plate.

FIG. 10 is a partial sectional view schematically illustrating the second step in which letters and so-called sacrifice portions are electroformed simultaneously.

FIG. 11 is a partial sectional view schematically illustrating the third step in which a strip of pressure sensitive adhesive film is adhesively secured to both the electroformed letters and the sacrifice portions so that they are removed from the metallic plate.

FIG. 12 is a partial sectional view schematically illustrating the fourth step in which each of the exposed surfaces of both the electroformed letters and the sacrifice portions is coated with an adhesive agent having a relatively high adhering power.

FIG. 13 is a partial sectional view schematically illustrating the fifth step in which only the sacrifice portions are removed from the metallic plate.

FIG. 14 is a partial sectional view schematically illustrating the sixth step in which the assembly of electroformed letters and film is placed on a product with some depressing force exerted thereon and the film is then peeled off therefrom.

FIG. 15 is a partial sectional view schematically illustrating a modification from the sixth step in FIG. 14 wherein the assembly of electroformed letters and film is covered with a strip of protective paper.

FIG. 16 is a partial plan view of the product with a few electroformed letters adhesively secured to the surface thereof, shown in an enlarged scale, and FIG. 17 is a plan view of the product with an array of electroformed letters, namely, "OUDENSHA" adhesively secured to the surface thereof.

DETAILED DESCRIPTION OF THE EMBODIMENTS

Now, the present invention will be described in a greater detail hereunder with reference to the accompanying drawings which schematically illustrate preferred embodiments of the invention.

Figure 1:
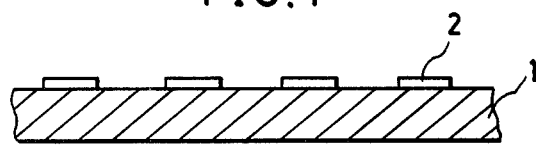
Figure 2:
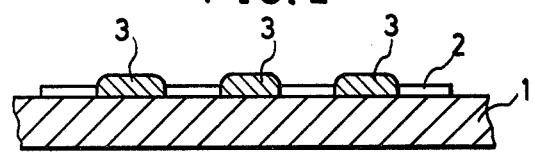
Figure 3:
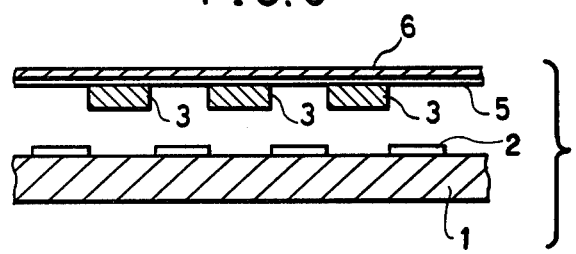
Figure 4:
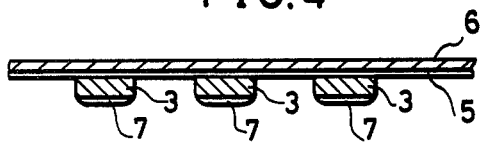
Figure 9:
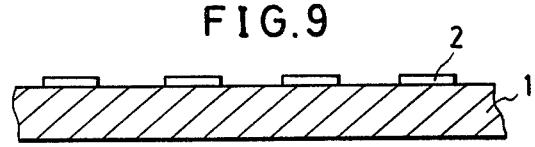

As illustrated in FIG. 1, the first step of a method in accordance with an embodiment of the invention is practiced by applying a layer of resist 2 onto a metallic plate 1 (made of, for instance, stainless steel) in a photographic printing process or the like with the exception of an area where a plurality of letters 3 are electroformed. The second step comprises electroforming as illustrated in FIG. 2. Next, in the third step the electroformed letters 3 are removed from the metallic plate 1 with the aid of a tape 6 made of synthetic plastic such as polyvinyl chloride the lower surface of which is coated with an adhesive agent 5 having a relatively week adhering power, as illustrated in FIG. 3. Then, in the fourth step another adhesive agent 7 is applied onto the lower surface of each of the electroformed letters 3, as illustrated in FIG. 4. It is preferable that application of the adhesive agent 7 in the fourth step is performed by roll coating or the like. The fifth step constituting the final step of the method of the invention comprises placing an assembly of the adhesive tape 6 and the electroformed letters 3 on a selected product 8 with some depressing force exerted thereon and then peeling off the adhesive tape 6, as illustrated in FIG. 5.

As a modification of the fifth step in FIG. 5 the assembly prepared in the fourth step may be covered with a strip of preventive or protective paper 9 so that it may be stored in an assembled state in a suitable room or place and it is later put in use in another place as required with said preventive or protective paper 9 being removed therefrom.

It should be noted that the electroformed letters 3 are coated with the first adhesive agent 5 on the bottom surface of the adhesive tape 6 and the second adhesive agent 7 is adapted to be covered with the preventive or protective paper 9 and the second adhesive agent 7 has an adhering power higher than that of the first adhesive agent 5 so that the electroformed letters 3 are adhesively secured to the product 8 without fail.

EXAMPLE I

A layer of photographic resist was formed on a stainless steel plate having a thickness of 0.3 mm, in a known process, with the exception of an area where a plurality of letters were electroformed. Electroforming was performed by immersing the stainless steel plate in a nickel electroforming bath until the electroformed letters had a thickness of about 50 microns. After completion of electroforming a strip of pressure sensitive adhesive film was then placed over an array of electroformed letters so that they were removed from the stainless steel plate. An adhesive agent having a higher adhering power was applied onto each of the exposed surfaces of the electroformed letters on the film by roll coating or the like operation and the assembly of adhesive film, electroformed letters and adhesive agent was placed on a selected product with some depressing pressure applied thereto while the adhesive coated surface was located opposite the product. After a certain period of time the adhesive film was peeled off and it was confirmed that a required or desired array of electroformed letters were correctly arranged on the product in an equally spaced relation as illustrated in FIG. 8.

Next, description will be made below as to a modified embodiment of the invention with reference to FIGS. 9 to 17. This embodiment of the invention consists in that so-called electroformed sacrifice portions adapted to be removed later are deposited at the position located in proximity to the electroformed letters. The electroformed sacrifice portions have two objects. Specifically, one of them is to inhibit excessive electroformation in the shape of a raised part along the periphery of letters to be electroformed; and the other one is to minimize unnecessary application of an adhesive agent on the surface of an adhesive tape or film outwardly of the electroformed letters, especially when the adhesive agent is applied onto each of the exposed surfaces of electroformed letters by spray coating. Thus, it is assured in accordance with the modified embodiment that the electroformed letters have a uniform thickness; and when an array of electroformed letters are placed on a product with some depressing force exerted thereon, very little of the adhesive agent is stuck on the product.

Figure 10:
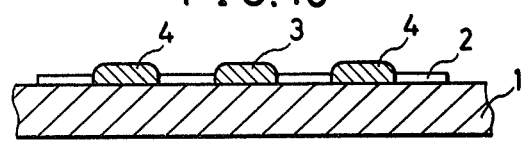
Figure 16:
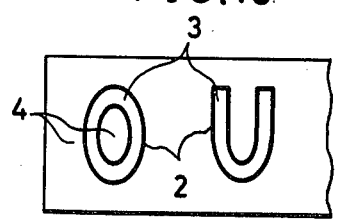

First, a layer of resist 2 is applied onto a metallic place (made of, for instance, stainless steel) by photographic printing or the like process in the first step as illustrated in FIG. 1. In the modified embodiment the layer of resist 2 is applied only onto limited areas as identified by black-colored lines extending along the periphery of the letters to be electroformed, as illustrated in FIG. 16. In the second step electroforming is practiced on the metalic plate 1 with the layer of resist 2 disposed thereon. In FIGS. 10 and 16 reference numeral 3 designates an electroformed numeral and reference letter 4 an electroformed sacrifice portion. As is best seen from FIG. 16, one of the electroformed sacrifice portions 4 is located outwardly of the electroformed letter "O" with a layer of resist 2 interposed therebetween and another one having the shape of a letter "O" is located inwardly of the electroformed letter "O" with another layer of resist 2 having the shape of the periphery of a letter "O" interposed therebetween.

Figure 11:
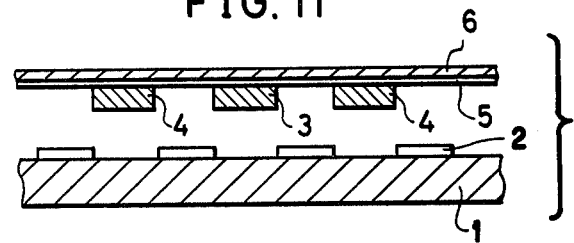
Figure 12:
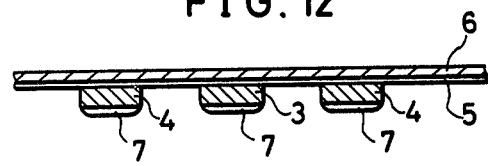
Figure 13:
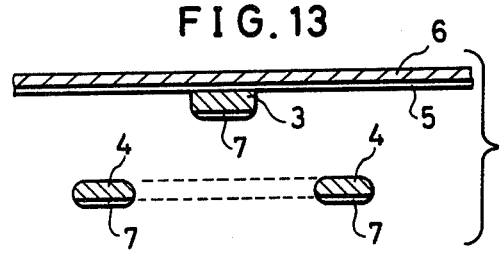
Figure 14:
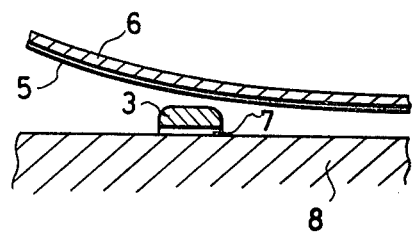
Figure 15:
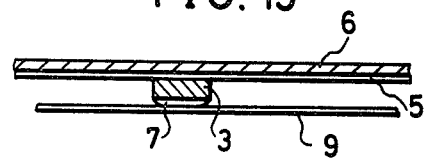

In the third step the electroformed letters 3 and the sacrifice portions 4 are removed from the metallic plate 1 and the layer of resist 2 with the aid of a tape 6 made of polyvinyl chrolide having a weak adhesive agent 5 coated thereon, as illustrated in FIG. 11. In the fourth step another adhesive agent 7 having an adhering power higher than that of said adhesive agent 5 is applied onto each of the exposed surfaces of the electroformed letters 3 and the sacrifice portions 4 by spray coating or the like process. It should be noted that a very small amount of adhesive agent 7 reaches the layer of resist 2 because the latter has a very narrow width. While spray coating is employed in the modified embodiment, any other suitable process may be used alternatively.

In the fifth step the electroformed sacrifice portions 4 are removed from the adhesive tape 6 by operating a conventional tool or device, while the electroformed letters 3 are kept immobile. Since the sacrifice portions 4 are unnecessary for the electroformed letters 3, they are thrown away later.

Figure 17:

Next, in the sixth step a series of letters 3 are transferred onto the surface of a product 8 in the same manner as in the foregoing embodiment. After the adhesive tape 6 is peeled off, it will be found that a required array of letters are correctly arranged on the product 8 in an equally spaced relation, as illustrated in FIG. 17.

As a modification from the above-mentioned sixth step a protective paper 9 may be placed on the adhesive coated surface of the letters 3 after completion of the fifth step. The assembly of electroformed letters 3, tape 6 and protective paper 9 is stored in a preselected room. When it is to be used later, the protective paper 9 is removed therefrom and the adhesive coated surface of the letters 3 is placed on the product with some depressing force exerted thereon.

It should be noted that the adhesive agent 7 on the exposed surfaces of the letters 3 has an adhering power higher than the adhesive agent 5 on the bottom surface of the adhesive tape 6 and therefore the electroformed letters 3 are stuck to the products 8 without fail.

Since the adhesive 7 coated on the sacrifice portions 4 is displaced from the tape 6 together with the sacrifice portions 4, there is no likelihood that an excess of the adhesive agent 7 in unnecessarily deposited at the position located outside the letters 3 as is often found when no sacrifice portion is provided.

EXAMPLE II

A layer of photographic resist having a width of 0.3 mm was formed in a conventional process along the periphery of a letter to be electroformed on a stainless steel plate having a thickness of 0.3 mm. Electroforming was performed by immersing the stainless steel plate with the layer of resist formed thereon in a nickel electroforming bath until the electroformed letters had a thickness of about 50 microns. After completion of electroforming a strip of pressure sensitive film having weak adhering power was then placed on a series of electroformed letters so that they are removed from the stainless steel plate. Next, an adhesive agent having high adhering power was coated on each of the exposed surfaces of the electroformed latters and the sacrifice portions on the adhesive tape. Thereafter only the sacrifice portions were removed from the tape together with the adhesive agent coated thereon, by manual operation with the aid of a conventional tool or device. Now, the assembly of electroformed letters and tape was ready to be placed on a product selected for the purpose. After they were adhesively secured to the product, the adhesive tape was removed therefrom and it was confirmed that a desired or required array of electroformed letters was correctly arranged on the product in an equally spaced relation as illustrated in FIG. 17.

While the present invention has been described above only with respect to the preferred embodiments, it should be noted that the invention should not be limited only to them and various changes or modifications may be made in a suitable manner without any departure of the spirit and scope of the invention.

What is claimed is:

1. A method of electroforming a plurality of letters, or letter-shaped patterns and fixedly arranging them in line in a spaced relation on a selected product, essentially comprising the steps of;

applying a layer of resist onto a metallic plate by photographic printing, carrying out electroforming with the metallic plate immersed in an electrolyte bath, removing the electroformed letters or letter-shaped patterns from the metallic plate with the aid of an adhesive tape having a weak adhering power, coating each of the exposed surfaces of the electro formed letters or patterns with an adhesive agent having an adhering power higher than that of the adhesive tape, placing the assembly of electroformed letters or patterns and adhesive tape on a selected product with some depressing force exerted thereon, and peeling off the adhesive tape from the electroformed letters or patterns.

2. A method as defined in claim 1, wherein the layer of resist is applied onto an area on the metallic plate excluding an area occupied by the letters or patterns to be electroformed.

3. A method as defined in claim 1, wherein the adhesive agent is coated on each of the exposed surfaces of the electroformed letters or patterns with the aid of a roller.

4. A method as defined in claim 1, wherein the adhesive coated surface of the electroformed letters or patterns is covered with a strip of protective paper before the letters or patterns are transferred onto the surface of a product.

5. A method of electroforming a plurality of letters, or letter-shaped patterns and fixedly arranging them in line in a spaced relation on a selected product, essentially comprising the steps of;

applying a layer of resist onto a metallic plate by photographic printing, carrying out electroforming with the metallic plate immersed in an electrolyte bath, removing the electroformed letters or patterns and electroformed sacrifice portions from the metallic plate with the aid of an adhesive tape or the like means having a weak adhering power, coating each of the exposed surfaces of both the electroformed letters or patterns and the electroformed sacrifice portions with an adhesive agent having an adhering power higher than that of the adhesive tape, removing only the sacrifice portions from the adhesive tape by manually operating a suitable tool or device, placing the assembly of electroformed letters or patterns and adhesive tape on a selected product with some depressing force exerted thereon, and peeling off the adhesive tape from the electroformed letters or patterns.

6. A method as defined in claim 5, wherein the layer of resist is applied onto a narrow area defined on the metallic plate between a letter or pattern and a sacrifice portion to be electroformed, said narrow area extending along the periphery of the letter or pattern to be electroformed.

7. A method as defined in claim 5, wherein the adhesive agent is coated on each of the exposed surfaces of both the electroformed letters or pattern and the sacrifice portions by spray coating.

8. A method as defined in claim 5, wherein the adhesive coated surface of the electroformed letters or the like patterns is covered with a strip of protective paper before said letters or patterns are transferred onto the surface of the product.

* * * * *